(12) United States Patent
Chung et al.

(10) Patent No.: US 8,122,302 B2
(45) Date of Patent: Feb. 21, 2012

(54) SEMICONDUCTOR DEVICE HAVING ADAPTIVE POWER FUNCTION

(75) Inventors: Hoe Ju Chung, Yongin (KR); Young Chan Jang, Yongin (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1265 days.

(21) Appl. No.: 11/543,112

(22) Filed: Oct. 5, 2006

(65) Prior Publication Data

US 2007/0124630 A1    May 31, 2007

(30) Foreign Application Priority Data

Nov. 28, 2005   (KR) .......................... 10-2005-114416

(51) Int. Cl.
G06F 11/00 (2006.01)
G06F 1/00 (2006.01)
G01R 31/28 (2006.01)
G05D 17/00 (2006.01)
H04B 7/00 (2006.01)

(52) U.S. Cl. ........ 714/708; 714/704; 714/712; 713/300; 700/297; 455/522

(58) Field of Classification Search .................. 714/724, 714/726, E11.169; 365/189.05, 230.05, 230.03
See application file for complete search history.

(56) References Cited

U.S. PATENT DOCUMENTS

| | | | | |
|---|---|---|---|---|
| 3,090,034 A * | 5/1963 | Fredericks et al. | ............ | 341/101 |
| 4,204,127 A * | 5/1980 | Carter, II | .......................... | 307/39 |
| 4,261,054 A * | 4/1981 | Scharla-Nielsen | .......... | 455/13.4 |
| 4,825,099 A | 4/1989 | Barton | | |
| 5,574,984 A * | 11/1996 | Reed et al. | ....................... | 455/69 |
| 5,734,598 A * | 3/1998 | Abbott et al. | .................. | 708/322 |
| 5,936,896 A | 8/1999 | Cho et al. | | |
| 6,184,730 B1 | 2/2001 | Kwong et al. | | |
| 6,246,620 B1 | 6/2001 | Fujioka et al. | | |
| 6,255,867 B1 | 7/2001 | Chen | | |
| 6,359,478 B1 | 3/2002 | Chow | | |
| 6,400,757 B1 * | 6/2002 | Tran et al. | ..................... | 375/152 |
| 6,577,554 B2 | 6/2003 | Song et al. | | |
| 6,900,663 B1 | 5/2005 | Roper et al. | | |
| 6,980,824 B2 * | 12/2005 | Hsu et al. | ...................... | 455/522 |
| 6,985,456 B2 * | 1/2006 | Gaskill et al. | ................. | 370/318 |
| 7,199,615 B2 * | 4/2007 | Stojanovic et al. | ............ | 326/82 |
| 2001/0024499 A1 * | 9/2001 | Hasegawa | ................ | 379/406.08 |
| 2002/0105925 A1 * | 8/2002 | Shoemake | .................... | 370/330 |
| 2004/0209635 A1 | 10/2004 | Hsu et al. | | |
| 2005/0226088 A1 | 10/2005 | Yu et al. | | |
| 2006/0139051 A1 * | 6/2006 | Gallo et al. | ..................... | 326/30 |

FOREIGN PATENT DOCUMENTS

| | | |
|---|---|---|
| CN | 1355964 | 6/2002 |
| KR | 10-1997-0012738 | 8/1995 |
| KR | 100200917 B1 | 3/1999 |
| KR | 1020020053485 A | 7/2002 |
| KR | 1020020058934 A | 7/2002 |
| KR | 1020020073701 A | 9/2002 |
| KR | 100593451 B1 | 6/2006 |

* cited by examiner

*Primary Examiner* — Cynthia Britt
*Assistant Examiner* — Daniel McMahon
(74) *Attorney, Agent, or Firm* — Harness, Dickey, & Pierce, P.L.C.

(57) ABSTRACT

In one embodiment, the semiconductor device includes at least one circuit element configured to generate output data. At least one control circuit is configured to adaptively control a power of the output data based on feedback from a receiving semiconductor device, which receives the output data.

48 Claims, 16 Drawing Sheets

|  | REG1 | SEL54 Output | REG2 |
|---|---|---|---|
| EN Enabled | 1111 ··· 11 | REG1 | 111 ··· 11 |
| 1st Clockpulse | 0111 ··· 11 | REG1 | 111 ··· 11 |
| 2nd Clockpulse | 0011 ··· 11 | REG1 | 011 ··· 11 |
| 3rd Clockpulse | 0001 ··· 11 | REG1 | 001 ··· 11 |
| er received | 1111 ··· 11 | REG2 | 001 ··· 11 |
|  | 1111 ··· 11 | REG2 | 001 ··· 11 |

|  | REG1' | SEL54 | REG2' |
|---|---|---|---|
| EN Enabled | 000···00 | REG1' | 1111···11 |
| 1st Clockpulse | 100···00 | REG1' | 1000···00 |
| 2nd Clockpulse | 110···00 | REG1' | 1100···00 |
| 3rd Clockpulse | 111···00 | REG2' | 1110···00 |
| er received | 000···00 | REG2' | 1110···00 |

SEMICONDUCTOR DEVICE HAVING ADAPTIVE POWER FUNCTION

BACKGROUND OF THE INVENTION

1. Field of the Invention

The present invention relates to semiconductor devices, and in particular, to a circuit having an adaptive power function.

2. Description of Related Art

FIG. 1 illustrates a prior art data output interface 100 of a semiconductor memory device and a prior art data input interface 200 of a memory controller. As shown, the data output interface 100 includes a data output part 10 that receives data output from a memory cell array (not shown) of the memory device and distributes k bits of parallel data to each of a plurality of parallel-to-serial converters (PSCs) 12-1~12-n. Each PSC 12 converts the received parallel data to differential serial data do1, do1B~don, donB.

A clock generator 14 generates k clock signals P1~Pk to clock the k bits of data for each PSC 12. The clock signals P1~Pk have different phases from one another, and may be synchronized with an externally received clock signal transferred from the memory controller 200. The PSCs 12 perform the parallel-to-serial conversion operation based on the received clock signals.

The data output interface 100 includes a plurality of output drivers 16-1~16-n. Each output driver (OD) 16 corresponds to one of the PSCs 12. More specifically, each OD 16 receives the differential serial data, and generates associated differential output signals DO1, DO1B~Don, DOnB. The differential output signals are sent over a signaling medium such as a bus to the input data interface 200.

A control circuit 18 outputs a control signal CON, which has bits c1~cm, to the ODs 16. The driving capability of each OD 16 is established in response to the control signal CON. The control circuit 18 includes a fuse structure for setting each bit c1~cm of the control signal CON. By cutting respective fuses in the fuse structure of the control circuit 18, the fixed value of each bit c1~cm is set. As will be appreciated, because the control signal CON is fixed, the swing width of the output signals DO1~DOn and their respective inverses DO1B~DOnB are also fixed. Stated another way, the driving capability of the ODs 16 is fixed. By setting respective bits in the register structure of the control circuit 18, the value of each bit c1~cm is set. As will be appreciated, because the control signal CON is set regardless of channel characteristics, the swing width of output signals DO1~DOn and their respective inverses DO1B~DOnB are also set regardless of channel characteristics. Stated another way, the driving capability of ODs 16 has no relationship with channel characteristics.

To guarantee stable operation of the memory system including the data output interface 100, the fixed value of the control signal CON, and therefore, the fixed driving capability of the ODs 16 is set relatively high. This also helps ensure high speed operation; but, as will be appreciated is detrimental to reducing power consumption.

As further shown in FIG. 1, the input data interface 200 includes input drivers (ID) 34-1~34-n, each corresponding to a respective one of the ODs 16. The IDs 34 convert the respectively received differential output data signals to differential input data di1, di1B~din, dinB. A plurality of serial-to-parallel converters (SPCs) 32-1~32-n, each convert the differential input data from a respective ID 34 into k bits of parallel data din1~dinn. A data input part 30 receives the parallel data from the SPCs 32 and outputs an input data stream. As with the output data interface 100, the input data interface 200 includes a clock generator 36. The clock generator 36 generates k clock signals. The clock signals have different phases from one another, and may be synchronized with an internal clock signal of the memory controller 200. The SPCs 32 perform the serial-to-parallel conversion operation based on the received clock signals.

SUMMARY OF THE INVENTION

In one embodiment of a semiconductor device according to the present invention, at least one circuit element is configured to generate output data, and at least one control circuit is configured to adaptively control a power of the output data based on feedback from a receiving semiconductor device, which receives the output data.

In one embodiment, the control circuit may be configured to periodically determine the output data power.

For example, the control circuit may be configured to, during the output data power determination, reduce the output data power over time from a starting power value until an error signal is received from the receiving semiconductor device indicating an error in the received output data. The control circuit may be configured to then establish the output data power as the output data power prior to the output data power resulting in the error signal.

In one embodiment, the control circuit may include a first storage, a second storage device and a selector. The first storage device may be configured to store an initial control signal representing the starting power value, and change the stored control signal over time. The second storage device may be configured to store the control signal previously stored by the first storage device. A selector may be configured to selectively output the control signal stored by one of the first and second storage devices as the power control signal. For example, the selector may be configured to output the control signal stored in the first storage device until the error signal indicates an error in the received output data and then outputs the control signal stored in the second storage device.

In another embodiment, the control circuit may be configured to perform an output power determination in response to an error signal indicating an error in the received output data. For example, the control circuit may be configured to, during the output data power determination, increase the output data power over time from a starting power value until the error signal indicates no error in the received output data.

In one embodiment, the control circuit may include a first storage device, a second storage device and a selector. The first storage device may be configured to store an initial control signal representing the starting power value, and change the stored control signal over time. The second storage device may be configured to store the control signal stored by the first storage device. The selector may be configured to selectively output the control signal stored by one of the first and second storage devices as the power control signal based on the error signal. For example, in one embodiment, the selector may configured to output the control signal stored in the first storage device until the error signal indicates no error in the received output data and then output the control signal stored in the second storage device.

In a further embodiment, the control circuit may be configured to perform a first output power determination periodically, and perform a second output power determination in response to an error signal indicating an error in the received output data if the first output power determination is not being performed.

In yet another embodiment, at least one parallel-to-serial converter (PSC) is a first circuit element, and the PSC is configured to convert input parallel data to serial input data. Also, at least one output driver is a second circuit element, and is configured to generate the output data based on the serial input data. A first control circuit may be configured to adaptively control power of the serial based on the feedback from the receiving semiconductor device, and a second control circuit may be configured to adaptively control power of the output data based on the feedback from the receiving semiconductor device.

In another embodiment of the present invention, a system includes a data output interface circuit configured to generate output data and a data input interface circuit configured to receive the output data from the data output interface circuit and generate the feedback information. The output data interface circuit may include at least one circuit element configured to generate output data, and at least one control circuit configured to adaptively control a power of the output data based on feedback information.

In a related embodiment, the input data interface circuit includes at least one error detector detecting an error in the output data from the data output interface circuit, and an error signal generator generating the feedback information based on output from the error detectors.

The present invention also relates to a method of adaptive power control. One embodiment of the method includes generating output data, and adaptively controlling the generating step to control power of the output data based on feed back from a receiving semiconductor device, which receives the output data.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting of the present invention and wherein.

DETAILED DESCRIPTION OF EXAMPLE EMBODIMENTS

The present invention relates to a data output interface and an associated data input interface. The data output interface may be the data output interface of a memory device and the data input interface may be the data input interface of a memory controller. However, it will be understood that the data output interface and data input interface of the present invention are not limited to this application.

Figure 1:
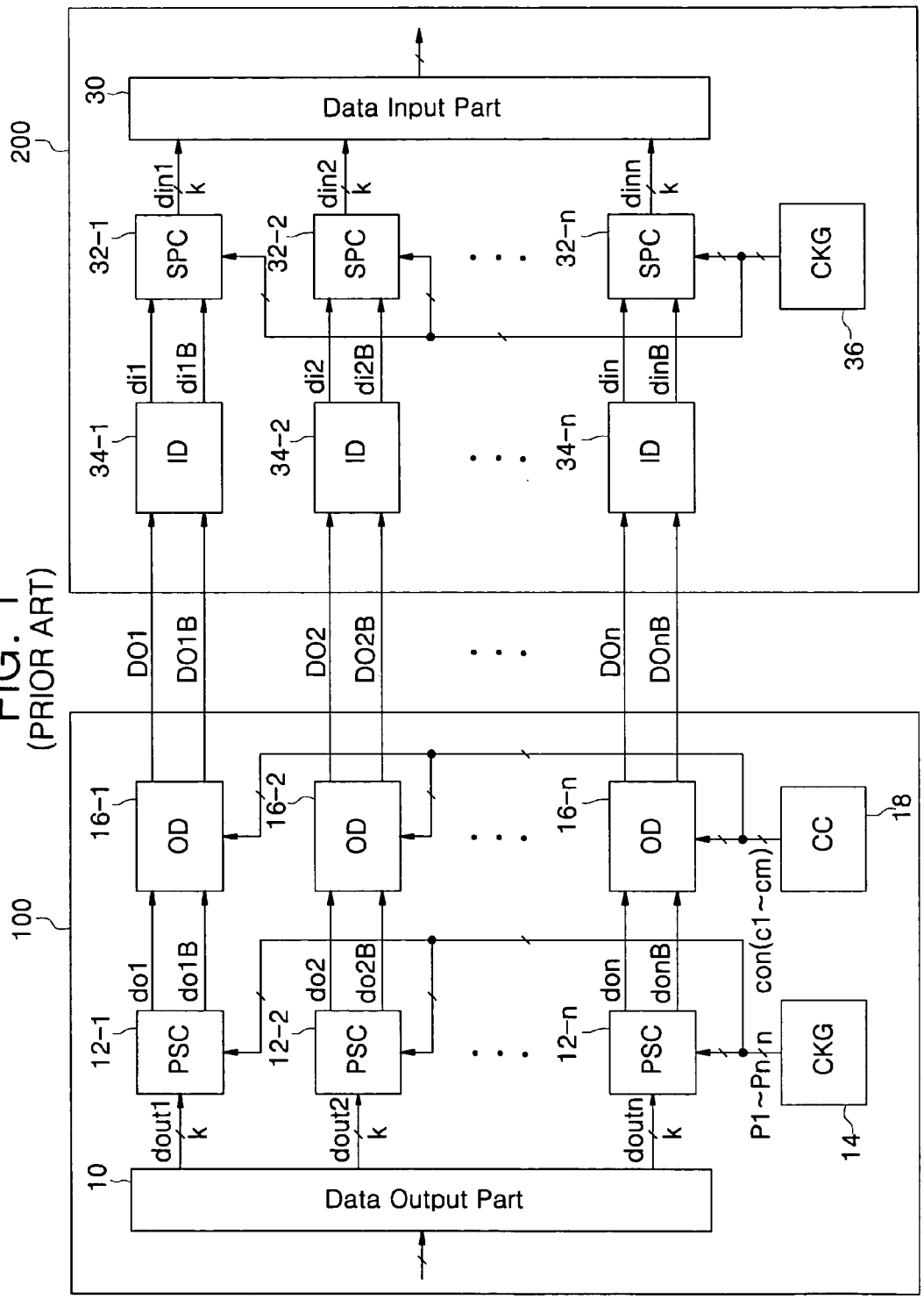
FIG. 1 illustrates a prior art data output interface of a semiconductor memory device and a prior art data input interface of a memory controller.
Figure 2:
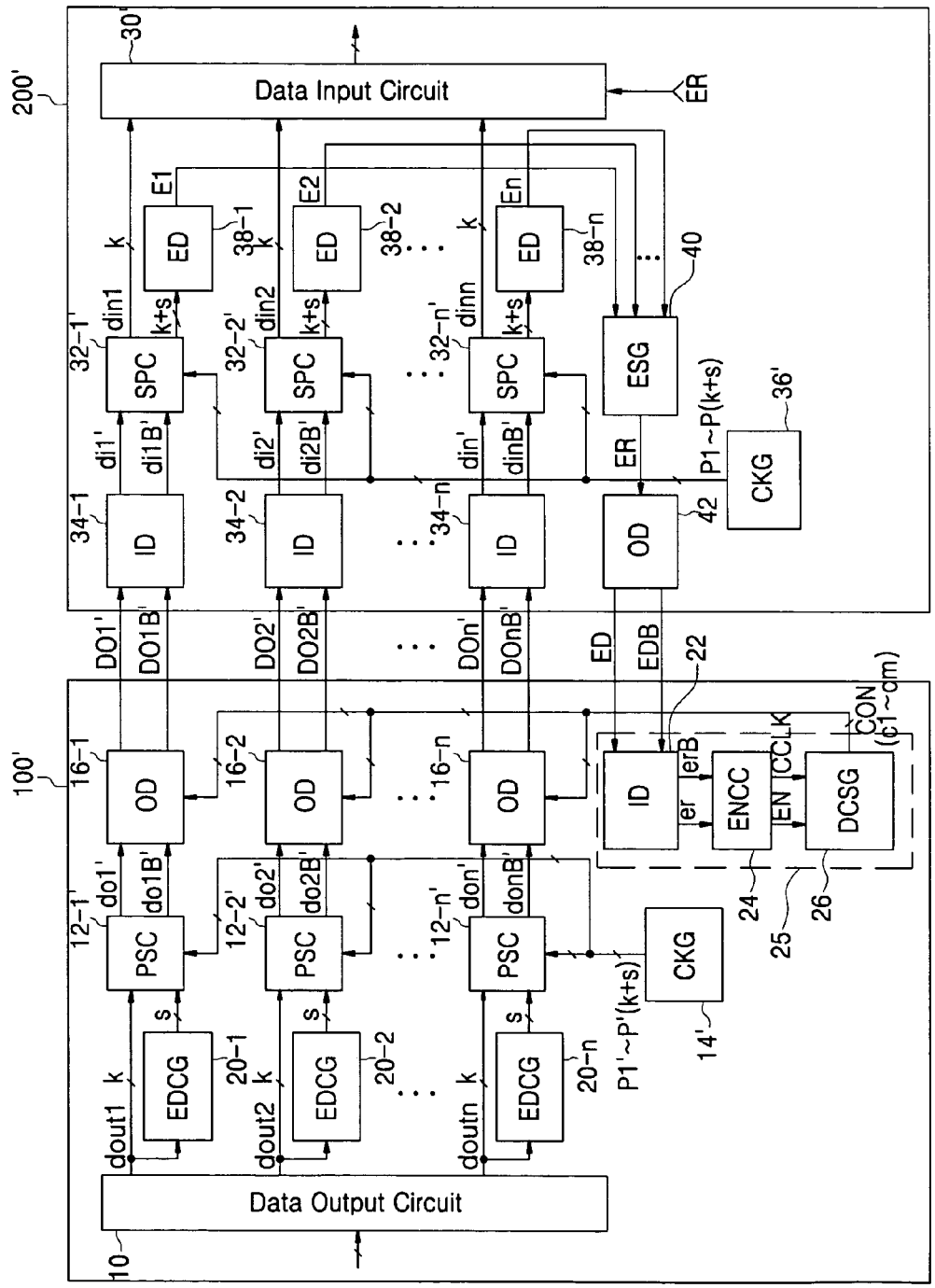
FIG. 2 illustrates a data output interface and an associated data input interface according to an embodiment of the present invention.

FIG. 2 illustrates a data output interface 100' and an associated data input interface 200' according to an embodiment of the present invention. As shown, the data output interface 100' includes the data output part 10 that receives data output from, for example, a memory cell array (not shown) and distributes k bits of parallel data to each of a plurality of parallel-to-serial converters (PSCs) 12-1'~12-$n$' and each of a plurality of error detector code generators (EDCGs) 20-1~20-$n$. Each EDCG 20 is associated with one of the PSCs 12', and generates an error code of s bits for the k bits received by the associated PSC 12. Each PSC 12' converts the received parallel data bits and associated code bits to differential serial data do1', do1B'~don', donB'

A clock generator 14' generates k+s clock signals P1'~P(k+s)' to clock the k+s bits for each PSC 12'. The clock signals P1'~P(k+s)' have different phases from one another, and may be synchronized with an externally received clock signal transferred from the memory controller 200'. The PSCs 12' perform the parallel-to-serial conversion operation based on the received clock signals.

The data output interface 100' includes a plurality of output drivers 16-1~16-$n$. Each output driver (OD) 16 corresponds to one of the PSCs 12'. More specifically, each OD 16 receives the differential serial data, and generates associated differential output signals D01', D01B'~D0n', D0nB'. The differential output data signals are sent over a signaling medium such as a bus to the input data interface 200'.

Figure 3A:
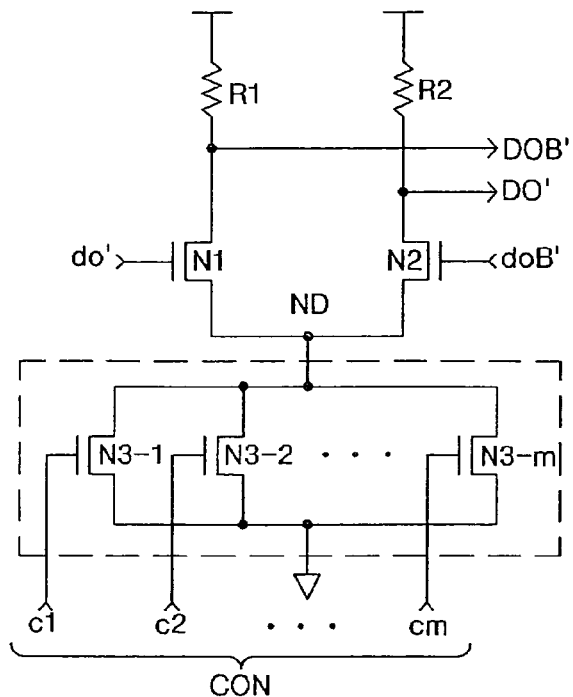
FIGS. 3A-3C illustrate embodiments of an output driver in FIG. 2 according to the present invention.

A control circuit 25 outputs a control signal CON, which has bits c1~cm, to the ODs 16. The driving capability of each OD 16 is established in response to the control signal CON. FIG. 3A illustrates an embodiment of an OD 16 according to the present invention. As shown, a resistor R1 is connected in series with a NMOS transistor N1 between a voltage supply line and a common node ND. A gate of the NMOS transistor N1 receives the differential serial data do, and a drain of the NMOS transistor N1 serves as the output of the inverse differential data signal DOB'. A resistor R2 is connected in series with a NMOS transistor N2 between the voltage supply line and the common node. A gate of the NMOS transistor N2 receives the inverse differential serial data doB', and a drain of the NMOS transistor N2 serves as the output of the differential output signal DO'.

A total of m NMOS transistors N3-1~N3-$m$ are connected in parallel between the common node ND and ground. Each NMOS transistor N3-1~N3-$m$ receives a respective one of the bit c1~cm forming the control signal CON. When the control bit c is logic high or a "1", then the respective NMOS transistor N3 turns on. Conversely, if the control bit c is logic low or a "0", then the respective NMOS transistor N3 turns off. Accordingly, the control signal CON controls which of the NMOS transistors N3 turn on. In this manner, the control signal CON controls the driving capability of the OD 16. The more NMOS transistors N3 turned on, the greater the driving capability of the OD 16. It will be appreciated that the NMOS transistors N3 may have different sizes, and therefore, offer different driving capabilities. This arrangement affords greater control of the driving capability of the OD 16.

During operation, if do' is larger than doB' then DO' will have a larger voltage than DOB', and vice versa.

Figure 3B:
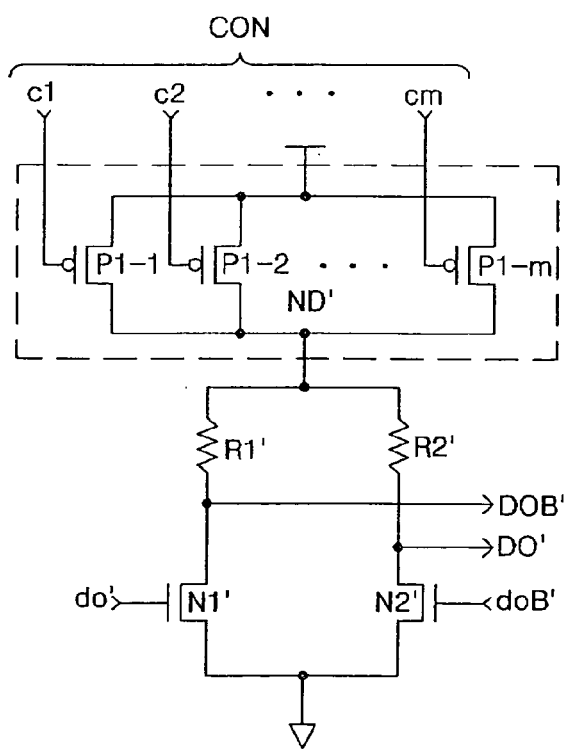

FIG. 3B illustrates another embodiment of the ODs 16 according to the present invention. As shown, a resistor R1' is connected in series with a NMOS transistor N1' between a common node ND' and ground. A gate of the NMOS transistor N1' receives the differential serial data do, and a drain of the NMOS transistor N1' serves as the output of the inverse differential data signal DOB'. A resistor R2' is connected in series with a NMOS transistor N2' between the common node and ground. A gate of the NMOS transistor N2' receives the inverse differential serial data doB', and a drain of the NMOS transistor N2' serves as the output of the differential output signal DO'.

A total of m PMOS transistors P1-1~P1-$m$ are connected in parallel between a voltage supply line and the common node ND'. Each PMOS transistor P1-1~P1-$m$ receives a respective one of the bits c1~cm forming the control signal CON. When the control bit c is logic high or a "1", then the respective PMOS transistor P1 turns off. When the control bit c is logic low or a "0", then the respective PMOS transistor P1 turn on. Accordingly, the control signal CON controls which of the PMOS transistors P1 turn on. In this manner, the control signal CON controls the driving capability of the OD 16. The more PMOS transistors P1 turned on, the greater the driving capability of the OD 16. It will be appreciated that the PMOS transistors P1 may have different sizes, and therefore, offer different driving capabilities. This arrangement affords greater control of the driving capability of the OD 16.

During operation, if do' is larger than doB', then DO' will have a larger voltage than DOB', and vice versa.

Figure 3C:
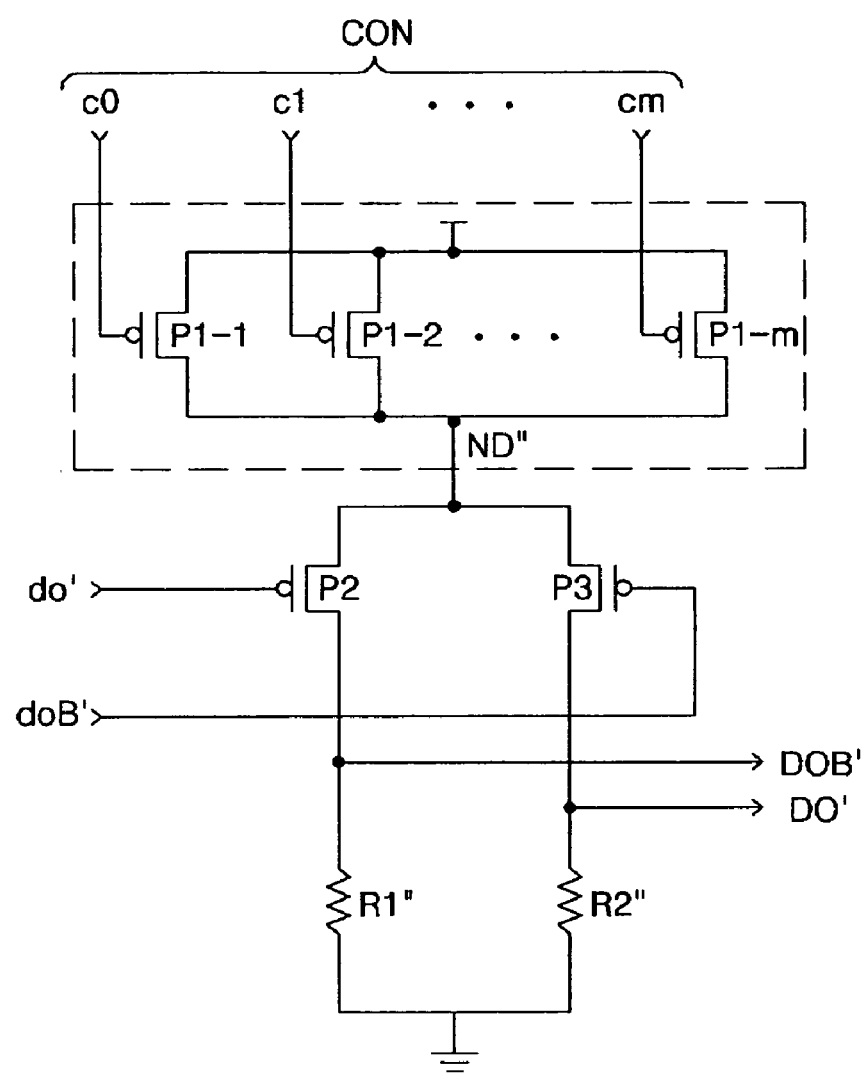

FIG. 3C illustrates another embodiment of the ODs 16 according to the present invention. As shown, a resistor R1" is connected in series with a PMOS transistor P2 between a common node ND" and ground. A gate of the PMOS transistor P2 receives the differential serial data do, and a drain of the PMOS transistor P2 serves as the output of the inverse differential data signal DOB'. A resistor R2" is connected in series with a PMOS transistor P3 between the common node ND" and ground. A gate of the PMOS transistor P3 receives the inverse differential serial data doB', and a drain of the PMOS transistor P3 serves as the output of the differential output signal DO'.

A total of m PMOS transistors P1-1~P1-$m$ are connected in parallel between a voltage supply line and the common node ND". Each PMOS transistor P1-1~P1-$m$ receives a respective one of the bits c1~cm forming the control signal CON. When the control bit c is logic high or a "1", then the respective PMOS transistor P1 turns off. When the control bit c is logic low or a "0", then the respective PMOS transistor P1 turn on. Accordingly, the control signal CON controls which of the PMOS transistors P1 turn on. In this manner, the control signal CON controls the driving capability of the OD 16. The more PMOS transistors P1 turned on, the greater the driving capability of the OD 16. It will be appreciated that the PMOS transistors P1 may have different sizes, and therefore, offer different driving capabilities. This arrangement affords greater control of the driving capability of the OD 16.

During operation, if do' is larger than doB', then DO' will have a larger voltage than DOB', and vice versa.

Returning to FIG. 2 and control circuit 25, as shown, the control circuit 25 generates the control signal CON based on signals received from the input data interface 200'. Accordingly, before describing the control circuit 25 in detail, the input data interface 200' will first be described.

Figure 4A:
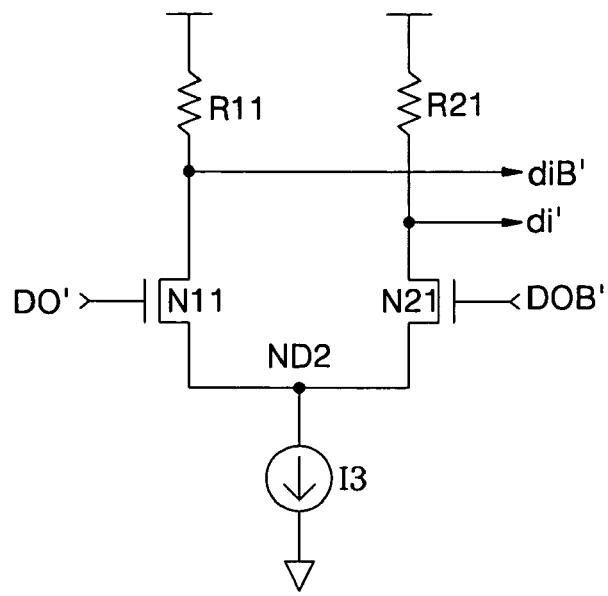
FIGS. 4A-4C illustrate embodiments of an input driver in FIG. 2 according to the present invention.

The input data interface 200' includes input drivers (ID) 34-1~34-$n$, each corresponding to a respective one of the ODs 16. The IDs 34 convert the respectively received differential output data signals to differential input data di1', di1B'~din', dinB'. FIG. 4A illustrates an example embodiment of an ID 34 according to the present invention. As shown, a resistor R11 and a NMOS transistor N11 are connected in series between a power supply line and a common node ND2. The gate of the NMOS transistor N11 receives the output data signal DO' from the output data interface 100'. A drain of the NMOS transistor N11 serves as the output of the series input data diB'. A resistor R21 and a NMOS transistor N21 are connected in series between the power supply line and the common node ND2. The gate of the NMOS transistor N21 receives the inverse output data signal DOB'. A drain of the NMOS transistor N21 serves as the output of the inverse series input data di. A constant current source 13 is connected between the common node ND2 and ground. During operation, if DO' is larger than DOB', then di' will have a larger voltage than diB', and vice versa.

Figure 4B:
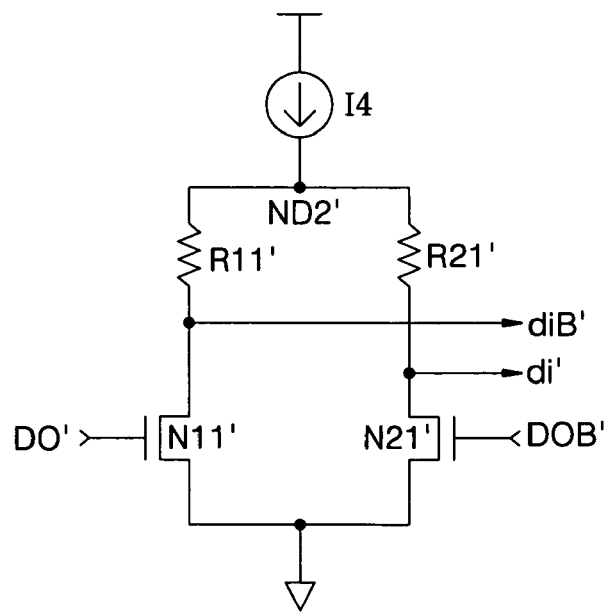

FIG. 4B illustrates another embodiment of an ID 34 according to the present invention. As shown, a resistor R11' and a NMOS transistor N11' are connected in series between a common node ND2' and ground. The gate of the NMOS transistor N11' receives the output data signal DO' from the output data interface 100'. A drain of the NMOS transistor N11' serves as the output of the inverse series input data diB'. A resistor R21' and a NMOS transistor N21' are connected in series between the common node ND2' and ground. The gate of the NMOS transistor N21' receives in the inverse output data signal DOB'. A drain of the NMOS transistor N21' serves as the output of the series input data di'. A constant current source 14 is connected between the common node ND2' and a power supply line. During operation, if DO' is larger than DOB', then di' will have a larger voltage than diB', and vice versa.

Figure 4C:
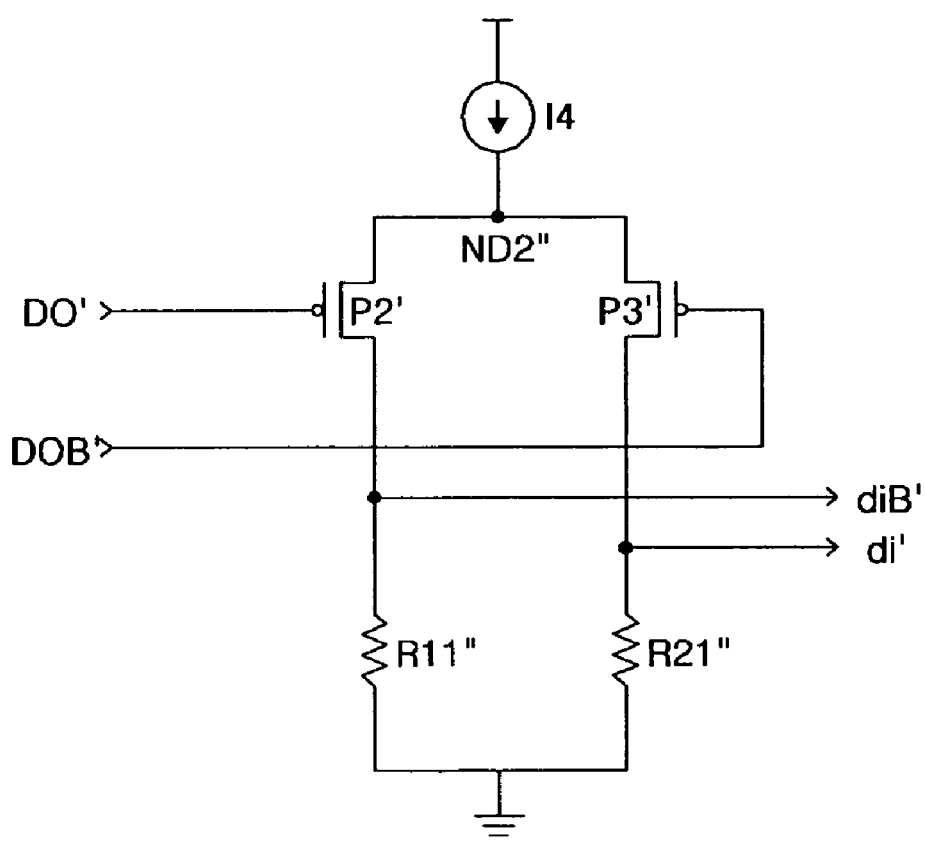

FIG. 4C illustrates another embodiment of an ID 34 according to the present invention. As shown, a resistor R11" and a PMOS transistor P2' are connected in series between a common node ND2" and ground. The gate of the PMOS transistor P2' receives the output data signal DO' from the output data interface 100'. A drain of the PMOS transistor P2' serves as the output of the inverse series input data diB'. A resistor R21" and a PMOS transistor P3' are connected in series between the common node ND2" and ground. The gate of the PMOS transistor P3' receives in the inverse output data signal DOB'. A drain of the PMOS transistor P3' serves as the output of the series input data di'. A constant current source 14 is connected between the common node ND2" and a power supply line. During operation, if DO' is larger than DOB', then di' will have a larger voltage than diB', and vice versa.

Returning to FIG. 2 and the input data interface 200', a plurality of serial-to-parallel converters (SPCs) 32-1'~32-$n$', each convert the differential input data from a respective ID 34 into k bits of parallel data din1~dinn and separately into k+s bits of parallel data. A data input part 30 receives the k bits of parallel data from the SPCs 32 and outputs an input data stream.

A plurality of error detectors (ED) 38-1~38-n, each associated with a respective one of the SPCs 32, receive the k+s bits output from the respective SPCs 32. The plurality of EDs 38-1~38-n generate respective individual error signals E1~En. Each individual error signal E indicates whether the k bits of parallel data was received in error or not. An error signal generator 40 receives the individual error signals E1~En and generates a collective error signal ER. For example, the error signal generator 40 may perform a logical OR operation on the individual error signals E1~En to generate the collective error signal ER.

The error signal ER is supplied to an OD 42, which may have the same structure as the ODs 16. Here, the inverse input to the OD 42 is supplied a fixed reference voltage. The OD 42 generates an error output signal ED and inverse error output signal EDB, which are sent to the output data interface 100'. For example, these signals may be sent over any suitable medium such as a bus.

As with the output data interface 100', the input data interface 200' includes a clock generator 36'. The clock generator 36' generates k+s clock signals. The clock signals have different phases from one another, and may be synchronized with an internal clock signal of device including the input data interface 200'. The SPCs 32' perform the serial-to-parallel conversion operation based on the received clock signals.

Returning once again to FIG. 2, the control circuit 25 and the operation thereof will now be described in greater detail. As shown, the control circuit 25 includes an ID 22, which may have the same structure as the IDs 34. The ID 22 receives the error output signal ED and inverse error output signal EDB, and generates an error signal er and inverse error signal erB. An enable and clock signal generator (ENCC) 24 periodically generates an enable signal EN and a clock signal CCLK, and terminates generation of the enable signal EN and clock signal CCLK based on the error signal er and the inverse error signal erB. A driving control signal generator (DCSG) 26 receives the enable signal EN and the clock signal CCLK, and based thereon, generates the control signal CON.

Figure 5:
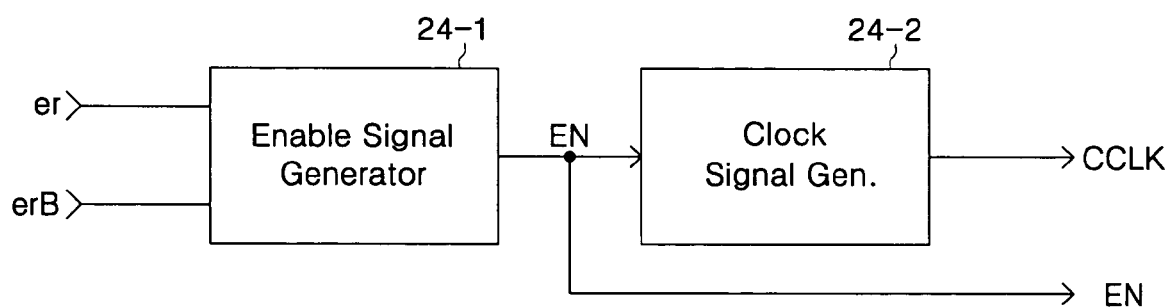
FIG. 5 illustrates an embodiment of the enable signal and clock signal generator in FIG. 2 according to the present invention.

FIG. 5 illustrates the ENCC 24 in greater detail. As shown, the ENCC 24 includes an enable signal generator 24-1, which periodically generates an enable signal EN. The enable signal generator 24-1 terminates generation of the enable signal EN based on the error signal er and the inverse error signal erB. A clock signal generator 24-2 generates the clock signal CCLK in response to the enable signal EN. Operation of the ENCC 24 will be described in more detail below with respect to the waveforms illustrated in FIG. 7A after the following detailed description of the DCSG 26.

Figure 6:
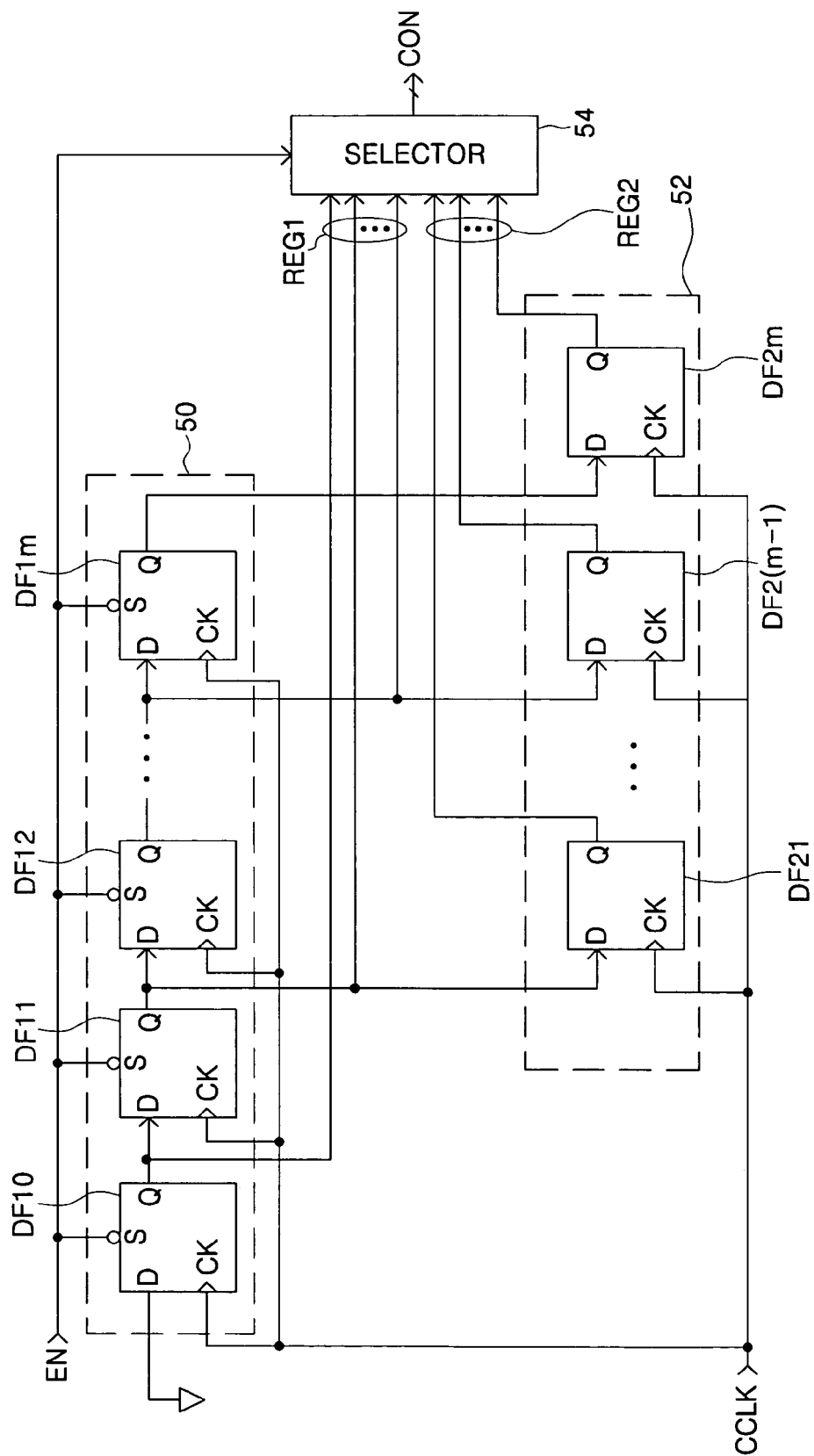
FIG. 6 illustrates an embodiment of the driving control signal generator (DCSG) in FIG. 2 according to the present invention.

FIG. 6 illustrates an example embodiment of the DCSG 26 according to an embodiment of the present invention. As shown, the DCSG 26 includes a first storage device 50 and a second storage device 52 connected to a selector 54. For example, in this embodiment, the first and second storage devices 50 and 52 are registers. However, the first and second storage devices 50 and 52 are not limited to being registers. As shown the register 50 includes m D flip-flops DF10~DF1m connected in cascade, with the first D flip-flop DF10 having its input connected to ground. Each D flip-flop DF1 receives the clock signal CCLK at its clock input, and has its set input receiving the enable signal EN. Accordingly, if the enable signal EN is logic low or "0" indicating non-enablement, then the D flip-flops DF1 of the register 50 are set, and each stores a logic high or "1". As will further be appreciated, when the enable signal EN is logic high or "1" indicating enablement, the D flip-flops DF1 are no longer continually set. Accordingly, clocking the D flip-flops DF1 causes a logic low or "0" to cascade through the D flip-flops DF1. The output of the first-mth D flip-flop DF10~DF1($m-1$) are supplied to the selector 54 as a first register input REG1. The output of each of the first-mth D flip-flops DF10~DF1($m-1$) corresponds to a respective bit c of the control CON (c1-cm).

The second register 52 includes m D flip-flops DF21~DF2m connected in cascade. The inputs of D flip-flops DF21~DF2m are respectively connected to the outputs of the second to (m+1)th D flip-flops DF11~DF1m. The clock inputs of the D flip-flops DF2 also receive the clock signal CCLK, and the outputs of the second D flip-flops DF2 are supplied to the selector 54 as a second register input REG2. The output of each of the first-mth D flip flops DF2 each correspond to one of the bits c1~cm of the control signal CON. Furthermore, as will be appreciated, in response to the clock signal CCLK, the D-flip-flops DF2 store the previous version of the first register input REG1. Stated another way, the second register input REG2 is the same as the first register input REG1 from the previous pulse of the clock signal CCLK.

The selector 54 selectively outputs one of the first register input REG1 and the second register input REG2 as the control signal CON. More specifically, and as described in greater detail below with respect to FIGS. 7A and 7B, the selector 54 outputs the first register input REG1 if the enable signal EN is enabled (logic high in this example) and outputs the second register input REG2 if the enable signal EN is not enabled (logic low in this example).

Figures 7A, 7B:
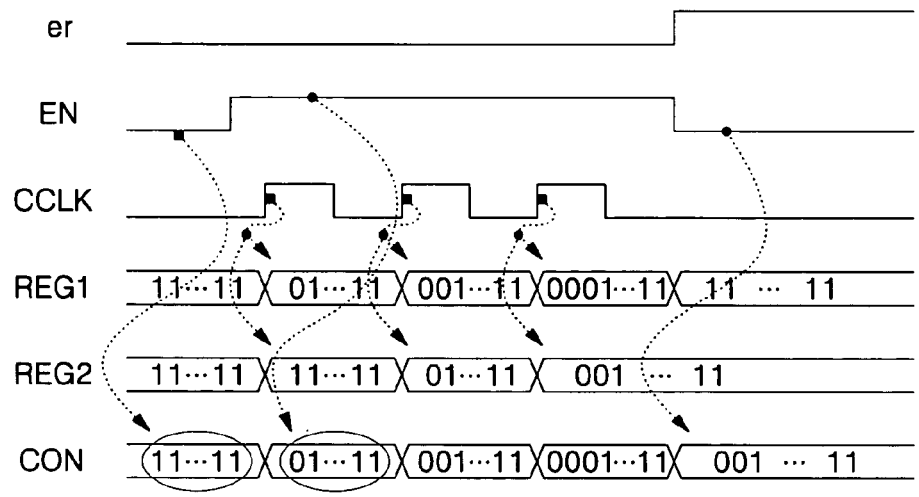
FIG. 7A illustrates waveforms generated by the control circuit including the DCSG of FIG. 6 during operation.
FIG. 7B illustrates the first and second register inputs REG1 and REG2 as well as the register input selected by the selector for an example operation of the control circuit shown in FIG. 7A.

Next, the operation of the control circuit 25 will be described in detail with respect to FIGS. 7A and 7B. FIG. 7A illustrates waveforms generated by the control circuit 25 during operation. FIG. 7B illustrates the first and second register inputs REG1 and REG2 as well as the register input selected by the selector 54 for this example operation of the control circuit 25.

Referring to FIG. 7A, FIG. 7A shows one example of a periodic enabling of the enable signal EN by the enable signal generator 24-1. The period with which the enable signal generator 24-1 enables the enable signal EN may be a matter of design choice. In response to the enable signal EN going logic high or "1" (e.g., enablement in this example embodiment), the clock signal generator 24-2 begins generating the clock signal CCLK. In response to the enable signal EN going logic high, the D flip-flops DF1 of the first register 50 are no longer continually set to 1, but the first register input REG1 will be all is as the enable signal EN was just logic low. With the enable signal EN logic high, the selector 54 outputs the first register input REG1 as the control signal CON. FIG. 7B illustrates this state of the first register input REG1 and the register input output by the selector 54.

Returning to FIG. 7A, in response to the enable signal EN going logic high, the clock signal CCLK is generated. Each pulse of the clock signal CCLK results in a logic low or "0" shifting into the series of first D flip-flops DF1. Also, each pulse of the clock signal CCLK causes the second series of D flip-flops DF2 to store the previous first register input REG1. As a result, the second register input REG2 output by the second register 52 equals the previous version of the first register input REG1. This is illustrated clearly in FIG. 7B for the three clock pulses of the clock signal CCLK illustrated in FIG. 7A.

As will be appreciated, the output of the selector 54 is the control signal CON, and when the enable signal EN first indicates enablement, the control signal CON becomes the all 1s state of the first register input REG1. As such, for example, all of the N3 transistors in each of the ODs 16 of FIG. 3A are turned on, and the output power of the ODs 16 is maximized. Then, as the first register input signal REG1 changes state to include logic zeros in response to the clock signal CCLK, the corresponding N3 transistors of the ODs 16 are turned off and the driving capability of the ODs 16 is reduced.

In this embodiment, the N3 transistors are sequentially turned off. However, it will be understood the first register 50 may be configured such that the N3 transistors are turned off in a different sequence and/or different combination. For example, more than one N3 transistor may be turned off at a time. Also, as stated above, the N3 transistors may be of different size and have different driving capabilities. The scheme with which the N3 transistors are turned off; therefore, may depend on their different driving capabilities. Furthermore, in response to the enable signal EN, the first register 50 may set the driving capabilities of the ODs 16 at less than their maximum driving capability.

It will also be understood that while the operation of this embodiment of the control circuit 25 has been described for use with the OD structure illustrated in FIG. 3A, the present invention is not limited to this application. The control circuit 25, for example, may also be used with the OD structure illustrated in FIG. 3B. In this instance, instead of setting the first D flip-flops DF1 and shifting in logic low values, the first D flip-flops DF1 are reset and logic high values are shifted in. This is because the driving transistors of the OD structure in FIG. 3B are PMOS transistors.

Returning to FIG. 7B, in this example, after the third clock pulse of the clock signal CCLK, the input data interface 200' generates a collective error signal ER indicating an error, which results in the ID 22 output an error signal er indicating an error. As will be appreciated, in response to the clock signal CCLK, the control signal CON reduces the driving capability of the ODs 16. At some point, the output data is driven at such a low output power by the ODs 16, that an error is detected by one of the error detectors ED. This results in the generation of the collective error signal ER and the error signal er.

Upon receipt of the error signal er, the generation of the logic high enable signal EN is terminated (i.e., the enable signal EN goes logic low in this embodiment). This causes the clock signal CCLK to terminate, and the selector 54 to output the second register input REG2 as the control signal CON. Accordingly, the ODs 16 will be driven according to the version of the control signal CON previous to the version which resulted in the error signal er being generated. This operation is further illustrated in FIG. 7B.

By periodically performing this process, the driving capability of the ODs 16 may be adaptively tuned such that power consumption is minimized while stable and high speed operation is ensured.

Figure 8:
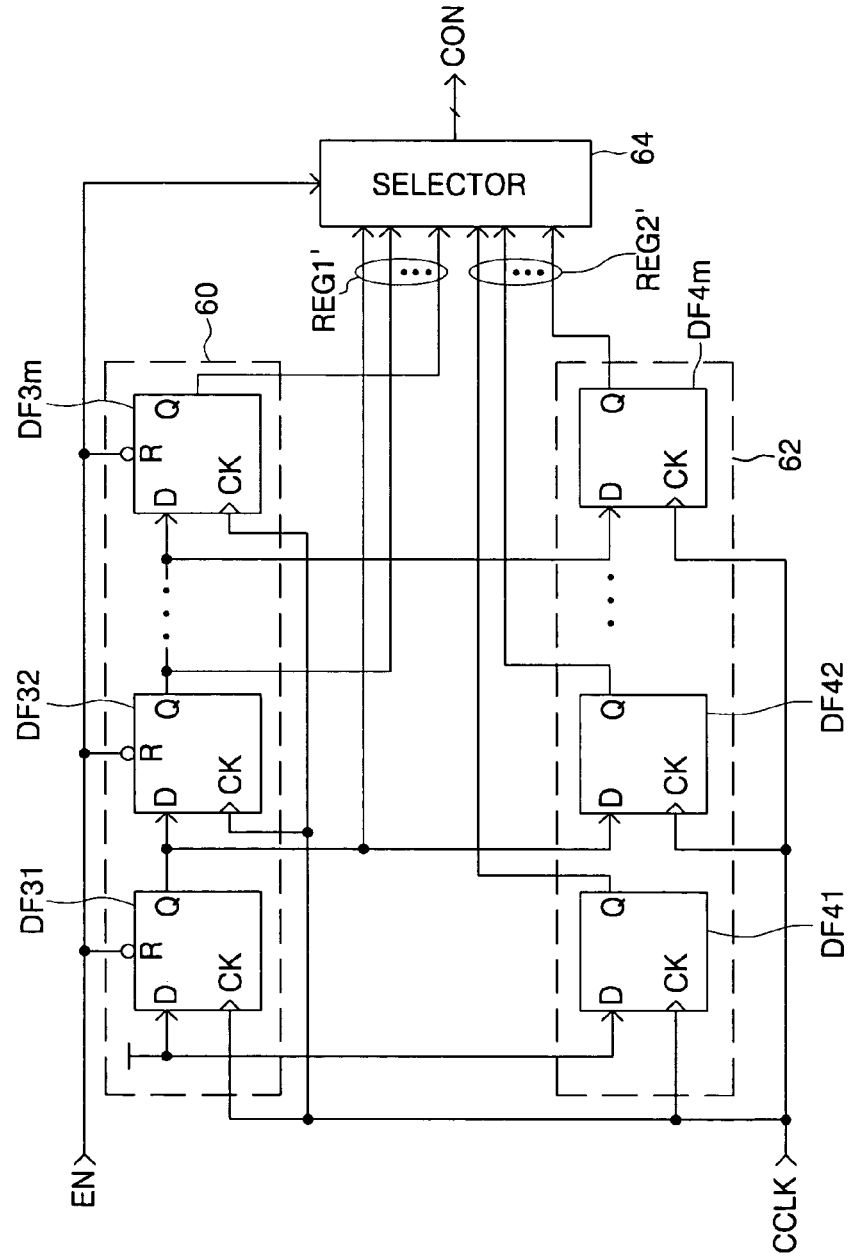
FIG. 8 illustrates another embodiment of the DCSG of FIG. 2 according to the present invention.

FIG. 8 illustrates another embodiment of the DCSG 26 according to the present invention. In this embodiment, the ENCC 24 does NOT generates the enable signal EN periodically. Instead, in this embodiment, the enable signal EN is generated in response to receiving the error signal er.

As shown, in the embodiment of FIG. 8, the DCSG 26 includes a first storage device 60 and a second storage device 62 connected to a selector 64. For example, in this embodiment, the first and second storage devices 60 and 62 are registers. However, the first and second storage devices 60 and 62 are not limited to being registers. As shown, the register 60 includes m D flip-flops DF31~DF3m connected in cascade, with the first D flip-flop DF31 having its input connected to the power supply voltage (e.g., high voltage). Each D flip-flop DF3 receives the clock signal CCLK at its clock input, and has its reset input receiving the enable signal EN. Accordingly, if the enable signal EN is logic low or "0" indicating non-enablement, then the D flip-flops DF1 of the register 50 are reset, and each stores a logic low or "0". However, when the enable signal EN is logic high or "1" indicating enablement, the D flip-flops DF3 are no longer reset. As will further be appreciated, when enabled, clocking the D flip-flops DF3 causes a logic high or "1" to cascade through the D flip-flops DF3. The output of the first-mth D flip-flop DF31~DF3m are supplied to the selector 54 as a first register input REG1'. The output of each of the first-mth D flip-flops DF31-DF3m corresponds to a respective bit c of the control CON (c1~cm).

The second register 62 includes m D flip-flops DF41~DF4m connected in cascade. The input of the first D flip-flop DF41 is connected to the power supply voltage. The inputs of the second to mth D flip-flops DF42~DF4m are respectively connected to the outputs of the first to (m−1)th D flip-flops DF32~DF3(m−1). The clock inputs of the D flip-flops DF4 also receive the clock signal CCLK, and the outputs of the D flip-flops DF4 are supplied to the selector 64 as a second register input REG2'. The D flip flops DF4 each correspond to one of the bits c1~cm of the control signal CON. Furthermore, as will be appreciated, in response to the clock signal CCLK, the D-flip-flops DF2 store the same version of the first register input REG1'. Stated another way, the second register input REG2' is the same as the first register input REG1' when the enable signal EN is enabled.

The selector 64 selectively outputs one of the first register input REG1' and the second register input REG2' as the control signal CON. More specifically, and as described in greater detail below with respect to FIGS. 9A and 9B, the selector 64 outputs the first register input REG1' if the enable signal is enabled (logic high in this example) and outputs the second register input REG2' if the enable signal is not enabled (logic low in this example).

Figures 9A, 9B:
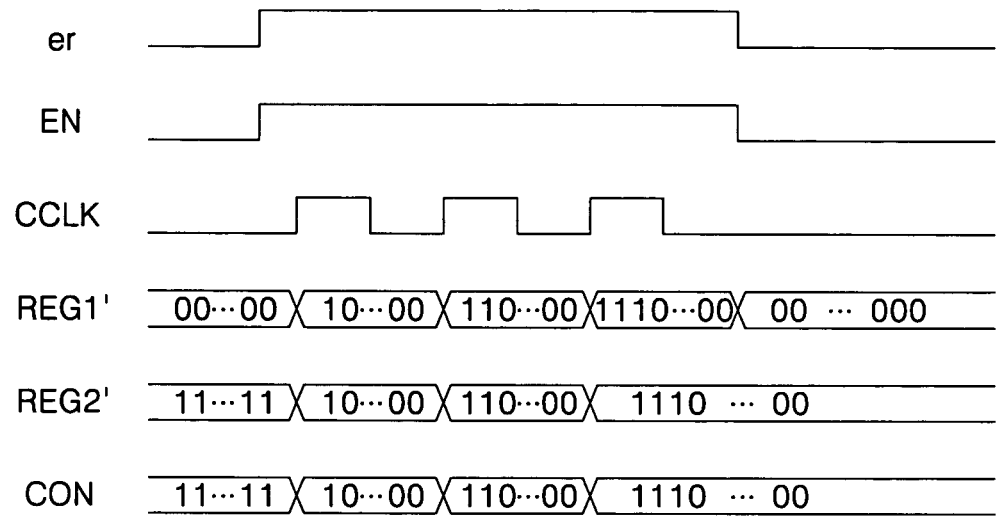
FIG. 9A illustrates waveforms generated by the control circuit including the DCSG of FIG. 8 during an example operation.
FIG. 9B illustrates the first and second register inputs REG1' and REG2' as well as the register input selected by the selector 54 for an example operation of the control circuit 25 shown in FIG. 9A

Next, the operation of the control circuit 25 will be described in detail with respect to FIGS. 9A and 9B. FIG. 9A illustrates waveforms generated by the control circuit 25 during operation. FIG. 9B illustrates the first and second register inputs REG1' and REG2' as well as the register input selected by the selector 64 for an example operation of the control circuit 25.

Referring to FIG. 9A, at some point during operation, the input data interface 200' generates the collective error signal ER indicating an error. This results in the ID 22 generating the error signal er indicating an error. In response to the error signal er, the enable signal generator 24-1 enables the enable signal EN (i.e., causes the enable signal EN to go logic high in this embodiment). This in turn causes the clock signal generator 24-2 to generate the clock signal CCLK.

In response to the enable signal EN going logic high, the D flip-flops DF3 of the first register 60 are no longer reset to 0, and each pulse of the clock signal CCLK results in a logic high or "1" shifting into the series of D flip-flops DF3. Also, each pulse of the clock signal CCLK causes the second series of D flip-flops DF4 to store the first register input REG1'. As a result, the second register input REG2' output by the second register 62 equals the first register input REG1'. This is illustrated clearly in FIG. 9B for the three clock pulses of the clock signal CCLK illustrated in FIG. 9A.

While the enable signal EN is enabled, the selector 64 outputs the first register input REG1'. As will be appreciated, the output of the selector 64 is the control signal CON, and when the enable signal EN is first enabled, the control signal CON becomes the all 0s state of the first register input REG1'. As such, for example, all of the N3 transistors in each of the ODs 16 of FIG. 3A are turned off, and the output power of the ODs 16 is minimized. Then, as the first register input signal REG1' changes state to include logic highs, in response to the clock signal CCLK, the N3 transistors of the ODs 16 are turned on and the driving capability of the ODs 16 increases.

In this embodiment, the N3 transistors are sequentially turned on. However, it will be understood the first register REG1' may be configured such that the N3 transistors turned on occur in a different sequence and/or different combination. For example, more than one N3 transistor may be turned on at a time. Also, as stated above, the N3 transistors may be of different sizes and have different driving capabilities. The scheme with which the N3 transistors are turned on, therefore, may depend on their different driving capabilities. Furthermore, in response to the enable signal EN, the first register 60 may set the driving capabilities of the ODs 16 at greater than their minimum driving capability.

It will also be understood that while the operation of this embodiment of the control circuit 25 has been described for use with the OD structure illustrated in FIG. 3A, the present invention is not limited to this application. The control circuit 25, for example, may also be used with the OD structure illustrated in FIG. 3B. In this instance, instead of resetting the first D flip-flops DF1 and shifting in logic high values, the first D flip-flops DF1 are set and logic low values are shifted in. This is because the driving transistors of the OD structure in FIG. 3B are PMOS transistors.

Returning to FIG. 9B, in this example, after the third clock pulse of the clock signal CCLK, the input data interface 200' no longer generates a collective error signal ER indicating an error, and this results in the ID 22 no longer outputting an error signal er indicating an error. As will be appreciated, in response to the clock signal CCLK, the control signal CON increases the driving capability of the ODs 16. At some point, the output data is driven at such a high output power by the ODs 16, that an error is no longer detected by one of the error detectors 38. This results in the generation of the collective error signal ER and the error signal er indicating no error.

Upon receipt of the error signal er indicating no error, the generation of the logic high enable signal EN is terminated (i.e., goes to logic low in this example embodiment). This causes the clock signal CCLK to terminate, and the selector 64 to output the second register input REG2' as the control signal CON. Accordingly, the ODs 16 will be driven according to the version of the control signal CON which resulted in the error signal er indicating no error. This operation is further illustrated in FIG. 9B.

By performing this process in response to an error, the driving capability of the ODs 16 may be adaptively tuned such that power consumption is minimized while stable and high speed operation is ensured.

Figure 10:
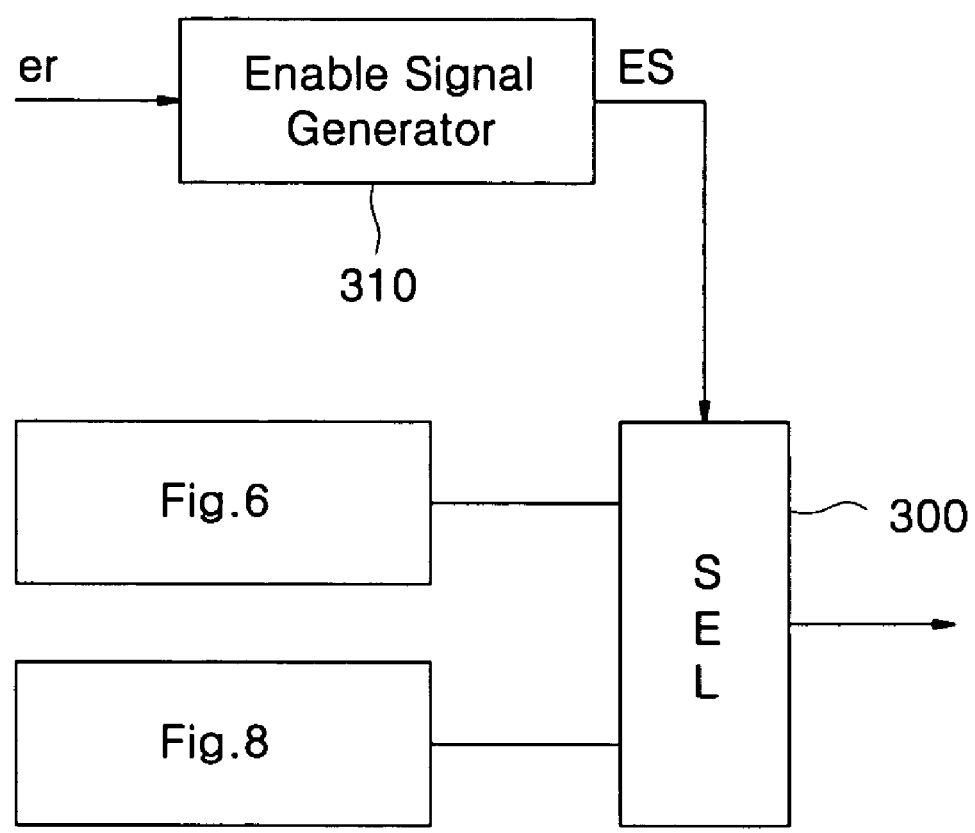
FIG. 10 illustrates another embodiment of the DCSG of FIG. 2 according to the present invention.

FIG. 10 illustrates another embodiment of the DCSG of FIG. 2 according to the present invention. In this embodiment, the DCSG includes the DCSG of FIG. 6 and the DCSG of FIG. 8. The output of each DCSG is connected to a selector 300. The selector 300 receives an enable signal ES generated by an enable signal generator 310. When this enable signal indicates enablement, for example, logic high, the selector 300 outputs the control signal CON from the DCSG of FIG. 6. When that enable signal does not indicate enablement, for example, logic low, the selector outputs the control signal CON from the DCSG of FIG. 8.

The enable signal generator 310 generates the enable signal periodically. For example, in one embodiment, the enable signal generator 310 generates the enable signal in synchronization with the enable signal generated by the DCSG of FIG. 6. Alternatively, the enable signal generated by the enable signal generator 310 may be used to trigger generation of the enable signal by the DCSG of FIG. 6. However, unlike the enable signal of the DCSG of FIG. 6, the enable signal generated by the enable signal generator 310 transitions from the enable state to the non-enable state a period of time after receipt of the error signal er received from either of the DCSG of FIG. 6 or the DCSG of FIG. 8. This allows time for the no error state to stabilize as the DCSG of FIG. 6 switches from outputting the first register input REG1 to outputting the second register input REG2.

Because of this operation, when the selector 300 switches to outputting the control signal from the DCSG of FIG. 8, the error signal er will indicate a no error state. This way, the DCSG of FIG. 8 will not be erroneously triggered into operation by operation of the DCSG of FIG. 6.

As will be appreciated, this embodiment of the present invention provides the advantages of both of the embodiments of FIGS. 6 and 8. As will also be appreciated, the DCSGs of FIGS. 6 and 8 include common circuitry, such as ID 22. Therefore, a single version of this common circuitry may be provided and shared by the DCSGs of FIGS. 6 and 8.

Figure 11:
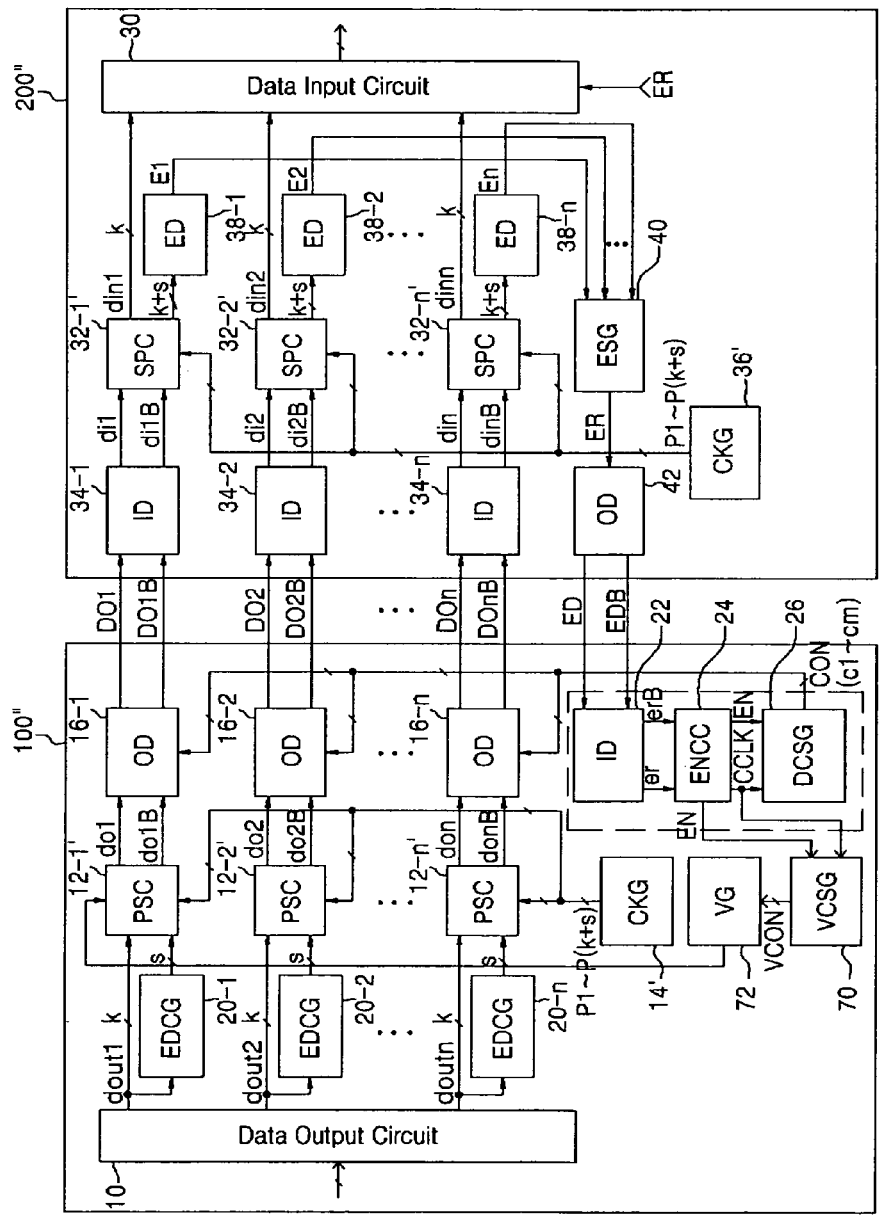
FIG. 11 illustrates a data output interface and an associated data input interface according to another embodiment of the present invention.

FIG. 11 illustrates a data output interface and an associated data input interface according to another embodiment of the present invention. The embodiment of FIG. 11 is the same the embodiment of FIG. 2 except that the embodiment of FIG. 11 further includes a voltage control signal generator (VCSG) 70 and a voltage generator 72. Accordingly, for the sake of brevity, only the structure and operation of these additional elements will be described.

The VCSG 70 has the same structure and operation as the DCSG 26, and receives the same inputs from the ENCC 24. Accordingly, the VSCG 70 generates a voltage control signal VCON in the same manner as the DCSG 26 generates the control signal CON according to any of the above described embodiments.

The voltage generator 72 receives the voltage control signal VCON and supplies a power supply voltage to the PSCs 12' based on the voltage control signal VCON. Accordingly, the same power control benefits achieved with respect to the ODs 16' are likewise achieved with respect to the PSCs 12'.

Figure 12A:
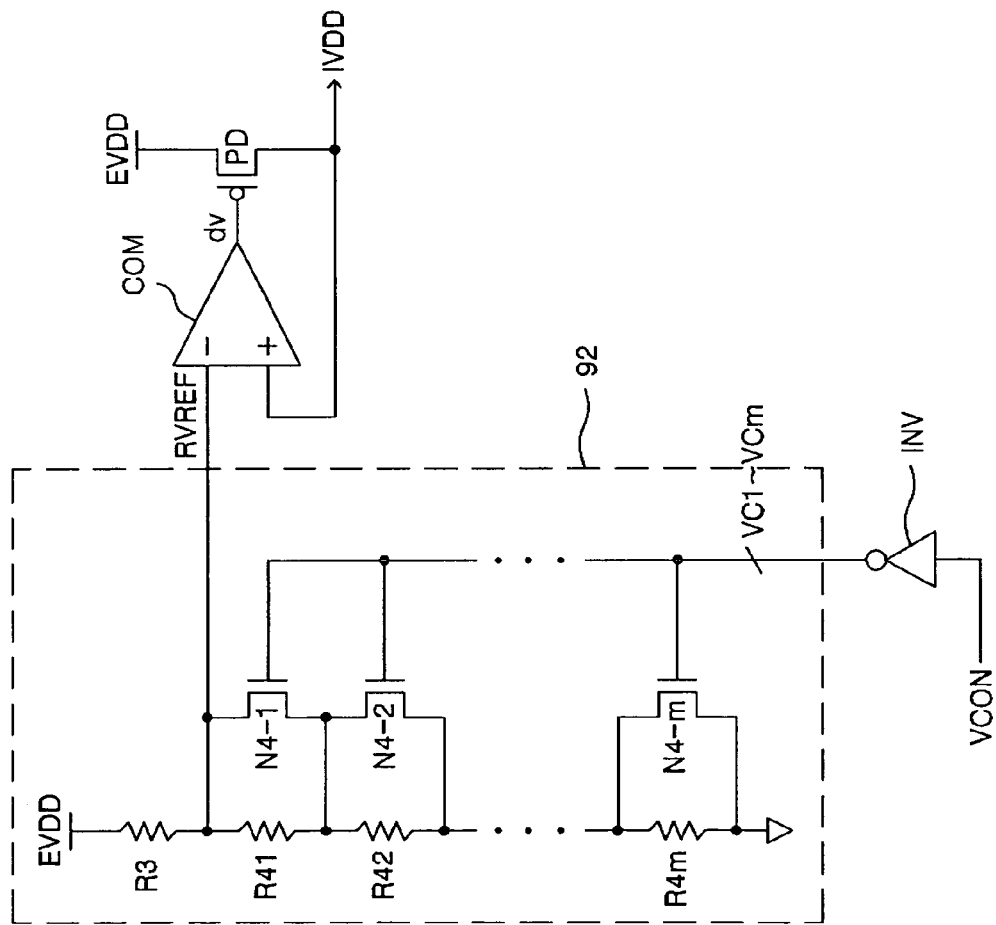
FIGS. 12A and 12B illustrate embodiments of the voltage generator of FIG. 11 according to the present invention.

FIG. 12A illustrates one embodiment of the voltage generator 72 according to an embodiment of the present invention. As shown, a resistor R3 is connected to a power supply voltage EVDD. A plurality of resistors R41~R4m are connected in series to the resistor R3. A plurality of NMOS transistors N4-1~N4-m are each connected in parallel with a respective one of the plurality of resistors R41~R4m. The gates of the plurality of NMOS transistor N4-1~N4-m respectively receive an inverted one of the bits VC1~VCm of the voltage control signal VCON. As shown, an inverter INV inverts the voltage control signal VCON applied to the NMOS transistors N4.

The node between the resistor R3 and the resistor R41 is connected to the inverting input of a comparator COM. The output of the comparator COM is connected to the gate of a PMOS transistor PD. The PMOS transistor PD has a source connected to the power supply voltage EVDD and a drain connected to the non-inverting input of the comparator COM. The drain of the PMOS transistor PD serves as the output of the voltage generator 72.

In operation, the voltage control signal VCON controls the number of NMOS transistors N4 to be turned-on; and therefore, controls the voltage at the inverting input of the comparator COM. For example, the more bits of the voltage control signal VCON are logic high, the fewer NMOS transistors N4 are on. Thus, the voltage at the non-inverting input is kept high. This causes the comparator COM to generate an output signal that turns on the PMOS transistor PD such that the output of the voltage generator 72 is high. The more NMOS transistor N4 turned off, the lower the voltage applied to the comparator COM becomes, and this reduces the output voltage of the voltage generator 72.

Figure 12B:
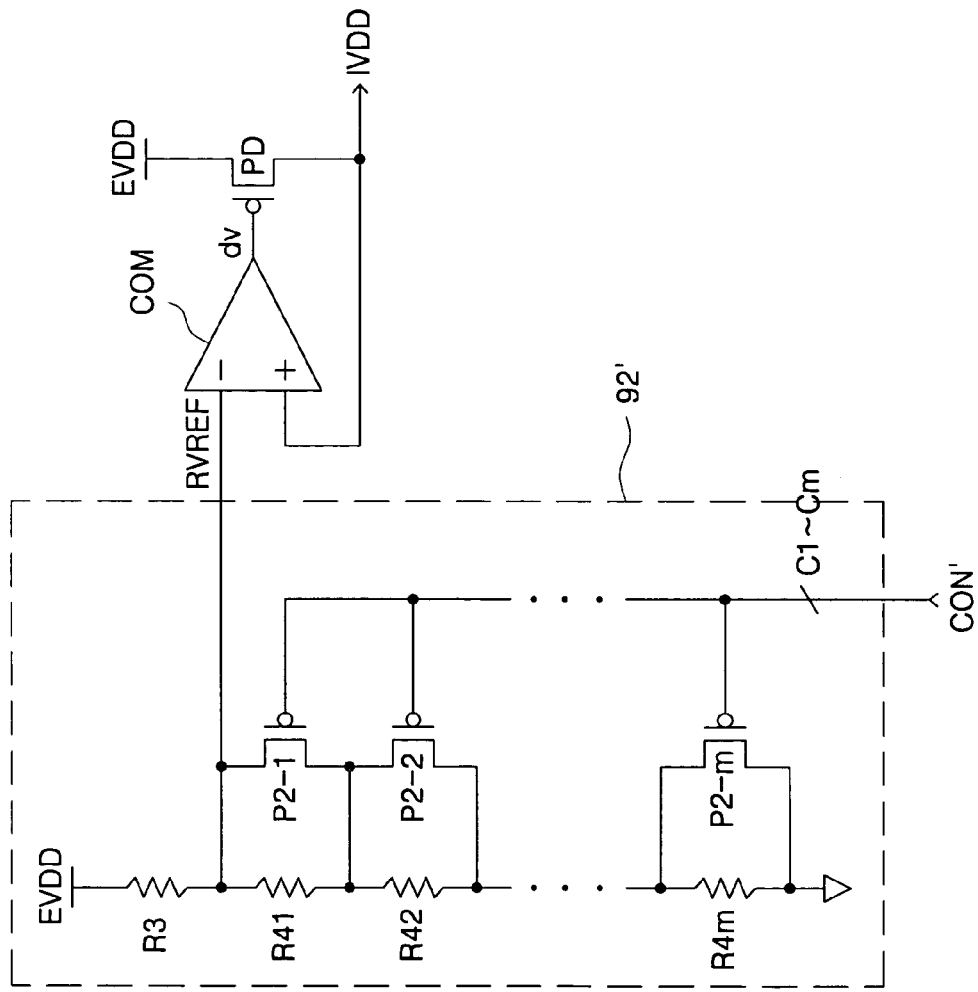

FIG. 12B illustrates another embodiment of the voltage generator 72 according to the present invention. In this embodiment, the NMOS transistors N4 of FIG. 12A have been replaced with PMOS transistors P2. The use of PMOS transistor P2 eliminates the need for the inverter INV in the embodiment of FIG. 12A. However, the operation of the voltage generator 72 as discussed above with respect to FIG. 12A remains the same for the embodiment of FIG. 12B.

Figure 13:
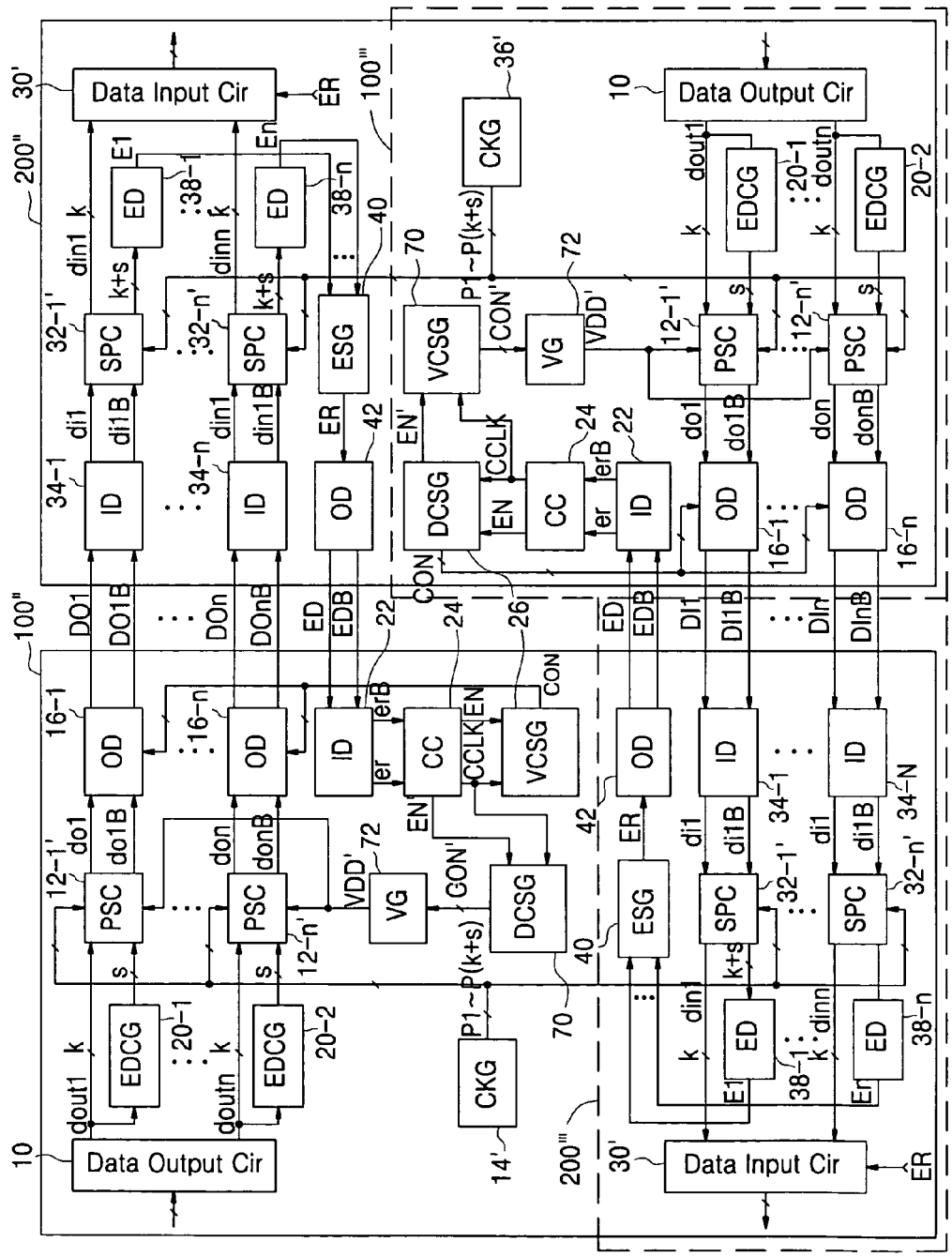
FIG. 13 illustrates a data output interface and an associated data input interface according to another embodiment of the present invention.

FIG. 13 illustrates a data output interface and an associated data input interface according to another embodiment of the present invention. The embodiment of FIG. 13 is the same the embodiment of FIG. 11 except that a first device includes an output data interface 100" connected to the input data interface 200" of a second device, and the second device includes an output data interface 100''' connected to the input data interface 200''' of the first device. This embodiment shows that a device is not limited to including one of the input data interface and the output data interface. Furthermore, it will be understood that that a device may include more than one input data interface and/or output data interface.

Also, while the embodiment of FIG. 13 used the input and output data interfaces of FIG. 11, the input and output data interfaces of FIG. 2 may be used instead.

The invention being thus described, it will be obvious that the same may be varied in many ways. For example, while the embodiment adaptive controlled the power of such circuit elements as output drivers and parallel-to-serial converters, the power control methodologies of the present invention are not limited in application to these circuit elements. Instead, the methodologies may be applied to other circuit elements such as multiplexers, etc. Such variations are not to be regarded as a departure from the invention, and all such modifications are intended to be included within the scope of the invention.

We claim:

1. A semiconductor device having adaptive power control, comprising:
at least one circuit element configured to generate output data; and
at least one control circuit configured to adaptively control a power of the output data by performing a first output data power determination based on feedback from a receiving semiconductor device, which receives the output data, wherein
during the first output data power determination, the at least one control circuit is configured to reduce the output data power over time from a first starting power value until an error signal is received from the receiving semiconductor device indicating an error in the received output data, and then establish the output data power as the output data power prior to the output data power resulting in the error signal.

2. The device of claim 1, wherein the at least one control circuit is configured to periodically perform the first output data power determination.

3. The device of claim 1, wherein the at least one control circuit is configured to reduce the output data power in stepwise decrements.

4. The device of claim 1, wherein
the at least one control circuit is configured to generate a power control signal indicative of the output data power; and the at least one circuit element is configured to generate the output data having a power indicated by the power control signal.

5. The device of claim 4, wherein the at least one control circuit comprises:
a first storage device configured to store an initial control signal representing the first starting power value as a control signal, and change the control signal over time; and
a second storage device configured to store the control signal previously stored by the first storage device; and
a selector configured to selectively output the control signal stored by one of the first storage device and the second storage device as the power control signal.

6. The device of claim 5, wherein the selector is configured to output the control signal stored in the first storage device until the error signal indicates an error in the received output data and then outputs the control signal stored in the second storage device.

7. The device of claim 6, wherein the at least one control circuit is configured to end the first output data power determination after the error signal indicates an error in the received output data, and the selector is configured to output the control signal stored in the second storage device until a next output data power determination and then output the control signal stored in the first storage device.

8. The device of claim 6, wherein the first storage device is configured to change the control signal until the error signal indicates an error in the received output data.

9. The device of claim 5, wherein
the first storage device is a first register that is configured to shift logic values stored therein such that the control signal represented by the logic values changes over time; and
the second storage device is a second register that is configured to store the logic values previously stored by the first storage device.

10. The device of claim 9, wherein the selector is configured to output the control signal stored in the first register until the error signal indicates an error in the received output data and then output the control signal stored in the second register.

11. The device of claim 10, wherein the at least one circuit element includes a plurality of power supply elements, each power supply element configured to selectively provide power for generating the output data based on a logic state of a respective logic value in the power control signal.

12. The device of claim 10, wherein the at least one control circuit comprises:
an enable signal generating circuit configured to periodically generate an enable signal to enable the first output data power determination; and wherein
the first register is configured to store the first starting power value in response to the enable signal.

13. The device of claim 12, wherein the at least one control circuit comprises:
a clock generating circuit configured to generate a clock signal in response to the enable signal; wherein
the first register is configured to change the logic values stored therein in response to the clock signal; and
the second register is configured to load logic values stored in the first register in response to the clock signal.

14. The device of claim 12, wherein
the enable signal generating circuit is configured to generate the enable signal enabling the first output data power determination until the error signal indicates an error in the received output data; and the selector is configured to output the control signal stored in the first register while the enable signal enables the first output data power determination and output the control signal stored in the second register while the enable signal disables the first output data power determination.

15. The device of claim 1, wherein the at least one control circuit is configured to perform a second output data power determination in response to an error signal indicating an error in the received output data.

16. The device of claim 15, wherein, during the second output data power determination, the at least one control circuit is configured to increase the output data power over time from a second starting power value until the error signal indicates no error in the received output data.

17. The device of claim 16, wherein the at least one control circuit is configured to increase the output data power in stepwise increments.

18. The device of claim 16, wherein
the at least one control circuit is configured to generate a power control signal indicative of the output data power; and
the at least one circuit element is configured to generate the output data having a power indicated by the power control signal.

19. The device of claim 18, wherein the at least one control circuit comprises:
a first storage device configured to store an initial control signal representing the second starting power value as a control signal, and change the control signal over time; and
a second storage device configured to store the control signal stored by the first storage device; and
a selector configured to selectively output the control signal stored by one of the first storage device and the second storage device as the power control signal based on the error signal.

20. The device of claim 19, wherein the selector is configured to output the control signal stored in the first storage device until the error signal indicates no error in the received output data and then output the control signal stored in the second storage device.

21. The device of claim 20, wherein the at least one control circuit is configured to end the second output data power determination if the error signal indicates no error in the received output data.

22. The device of claim 20, wherein the first storage device is configured to change the control signal until the error signal indicates an error in the received output data.

23. The device of claim 20, wherein the first storage device is configured to reset to storing the initial control signal if the error signal indicates no error in the received output data.

24. The device of claim 19, wherein
the first storage device is a first register that is configured to change logic values stored therein such that the control signal represented by the logic values changes over time; and
the second storage device is a second register that is configured to store the logic values stored by the first register.

25. The device of claim 24, wherein the selector is configured to output the control signal stored in the first register until the error signal indicates no error in the received output data and then output the control signal stored in the second register.

26. The device of claim 25, wherein the at least one circuit element includes a plurality of power supply elements, each power supply element is configured to selectively provide power for generating the output data based on a logic state of a respective logic value in the power control signal.

27. The device of claim 25, wherein the at least one control circuit comprises:
an enable signal generating circuit configured to generate an enable signal to enable the second output data power determination if the error signal indicates an error in the received output data; and wherein
the first register is configured to store the second starting power value in response to the enable signal.

28. The device of claim 27, wherein the at least one control circuit comprises:
a clock generating circuit configured to generate a clock signal in response to the enable signal; wherein
the first register is configured to shift the logic values stored therein in response to the clock signal; and
the shift register is configured to load logic values stored in the first register in response to the clock signal.

29. The device of claim 27, wherein
the enable signal generating circuit is configured to generate the enable signal enabling the second output data power determination until the error signal indicates no error in the received output data; and
the selector is configured to output the control signal stored in the first register while the enable signal enables the second output data power determination and outputs the control signal stored in the second register while the enable signal disables the second output data power determination.

30. The device of claim 1, wherein the at least one control circuit is configured to perform the first output data power determination periodically, and perform a second output data power determination in response to an error signal indicating an error in the received output data if the first output data power determination is not being performed.

31. The device of claim 30, wherein, during the second output data power determination, the at least one control circuit is configured to increase the output data power over time from a second starting power value until the error signal indicates no error in the received output data.

32. The device of claim 31, wherein the at least one control circuit comprises:
a first sub-control circuit configured to perform the first output data power determination;
a second sub-control circuit configured to perform the second output data power determination; and
a selector selecting output of the first sub-control circuit during the periodic enabling of the first output data power determination and, otherwise, selecting output of the second sub-control circuit.

33. The device of claim 32, wherein the selector receives a periodic enabling signal indicating to select the output of the first sub-control circuit.

34. The device of claim 30, wherein, during the second output data power determination, the at least one control circuit is configured to increase the output data power over time from a second starting power value until the error signal indicates no error in the received output data.

35. The device of claim 1, wherein the at least one circuit element is an output driver.

36. The device of claim 1, wherein the at least one circuit element is a parallel-to-serial converter.

37. The device of claim 1, further comprising:
at least one parallel-to-serial converter (PSC) as a first circuit element, the PSC configured to convert input parallel data to serial data;

at least one output driver as a second circuit element, configured to generate the output data based on the input data;

a first control circuit configured to adaptively control power of the serial based on the feedback from the receiving semiconductor device; and a second control circuit configured to adaptively control power of the output data based on the feedback from the receiving semiconductor device.

38. The device of claim 1, wherein the at least one circuit element and the at least one control circuit form part of a data output interface circuit in a memory device.

39. A system, comprising:

a data output interface circuit configured to generate output data, the output data interface circuit including,
- at least one circuit element configured to generate output data, and
- at least one control circuit configured to adaptively control a power of the output data by performing an output data power determination based on feedback information from a receiving semiconductor device, wherein
  - during the output data power determination, the at least one control circuit is configured to reduce the output data power over time from a starting power value until an error signal is received from the receiving semiconductor device indicating an error in the received output data, and then establish the output data power as the output data power prior to the output data power resulting in the error signal; and a data input interface circuit configured to receive the output data from the data output interface circuit and generate the feedback information.

40. The system of claim 39, wherein the data input interface circuit comprises:

at least one error detector detecting an error in the output data from the data output interface circuit.

41. The system of claim 40, wherein the data input interface circuit comprises:

an error signal generator generating the feedback information based on output from the error detectors.

42. The system of claim 40, further comprising:

a memory device including the data output interface circuit; and a memory controller including the data input interface circuit.

43. The system of claim 40, further comprising:

a memory controller including the data output interface circuit; and a memory device including the data input interface circuit.

44. A method of adaptive power control, comprising:

generating output data;

adaptively controlling the generating step to control a power of the output data by performing an output data power determination based on feedback from a receiving semiconductor device, which receives the output data, wherein
- the adaptively controlling includes reducing the output data power over time, by at least one control circuit, during the output data power determination from a starting power value until an error signal is received from the receiving semiconductor device indicating an error in the received output data, and then establishing the output data power as the output data power prior to the output data power resulting in the error signal.

45. The method of claim 44, wherein the adaptively controlling step periodically performs the output data power determination.

46. The semiconductor device of claim 1, wherein the at least one control circuit is configured to receive the feedback through a tangible medium.

47. The system of claim 39, wherein the at least one control circuit is configured to receive the feedback through a tangible medium.

48. The method of claim 44, wherein the adaptively controlling includes receiving the feedback through a tangible medium.

* * * * *